United States Patent
Pham et al.

(10) Patent No.: US 10,298,110 B2
(45) Date of Patent: May 21, 2019

(54) POWER CONVERTER CONTROLLER WITH STABILITY COMPENSATION

(71) Applicant: Power Integrations, Inc., San Jose, CA (US)

(72) Inventors: Giao Minh Pham, Milpitas, CA (US); Vikram Balakrishnan, Mountain View, CA (US); Arthur B. Odell, Morgan Hill, CA (US); Antonius Jacobus Johannes Werner, Cambridge (GB); Karl Moore, Cambridgeshire (GB); Matthew David Waterson, Cambridge (GB)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/962,131

(22) Filed: Apr. 25, 2018

(65) Prior Publication Data

US 2018/0248466 A1 Aug. 30, 2018

Related U.S. Application Data

(63) Continuation of application No. PCT/US2017/034828, filed on May 26, 2017.
(Continued)

(51) Int. Cl.
*H02M 1/08* (2006.01)
*G05F 3/26* (2006.01)
(Continued)

(52) U.S. Cl.
CPC ............... *H02M 1/08* (2013.01); *G05F 3/26* (2013.01); *H02M 1/143* (2013.01);
(Continued)

(58) Field of Classification Search
CPC .......... G05F 3/26; H02M 1/08; H02M 1/143; H02M 2001/0025; H02M 2001/0048; H02M 3/33576; H02M 7/217
See application file for complete search history.

(56) References Cited

U.S. PATENT DOCUMENTS

| | | | |
|---|---|---|---|
| 5,282,107 A | 1/1994 | Balakrishnan | |
| 5,952,949 A * | 9/1999 | Coy | H03K 4/06 327/142 |

(Continued)

*Primary Examiner* — Adolf Berhane
*Assistant Examiner* — Bart Iliya
(74) *Attorney, Agent, or Firm* — The Law Offices of Bradley J. Bereznak

(57) ABSTRACT

A switched mode power converter has an energy transfer element that delivers an output signal to a load. A power switching device coupled to the primary side of the energy transfer element regulates a transfer of energy to the load. A secondary controller is coupled to receive a feedback signal and output a pulsed signal in response thereto. A primary controller is coupled to receive the pulsed signal and output a drive signal in response thereto, the drive signal being coupled to control switching of the power switching device. A compensation circuit generates an adaptively compensated signal synchronous with the pulsed signal. The adaptively compensated signal has a parameter that is adaptively adjusted in response to a comparison of the feedback signal with a threshold reference signal. The parameter converges towards a final value that produces a desired level of the output signal.

15 Claims, 8 Drawing Sheets

Related U.S. Application Data

(60) Provisional application No. 62/394,975, filed on Sep. 15, 2016.

(51) Int. Cl.
*H02M 3/335* (2006.01)
*H02M 1/14* (2006.01)
*H02M 7/217* (2006.01)
*H02M 1/00* (2006.01)
*H03K 5/24* (2006.01)

(52) U.S. Cl.
CPC ....... *H02M 3/33576* (2013.01); *H02M 7/217* (2013.01); *H03K 5/24* (2013.01); *H02M 2001/0025* (2013.01); *H02M 2001/0048* (2013.01)

(56) References Cited

U.S. PATENT DOCUMENTS

| | | |
|---|---|---|
| 6,150,871 A | 11/2000 | Yee |
| 6,445,600 B2 | 9/2002 | Ben-Yaakov |
| 6,577,512 B2 | 6/2003 | Tripathi et al. |
| 6,724,244 B2 | 4/2004 | Wu |
| 6,933,769 B2 | 8/2005 | Koelling |
| 7,092,268 B2 | 8/2006 | George |
| 7,193,402 B2 | 3/2007 | Lee et al. |
| 7,295,451 B2 | 11/2007 | Donald |
| 7,301,389 B2 | 11/2007 | Coady |
| 7,348,830 B2 | 3/2008 | Debroux |
| 7,408,796 B2 | 8/2008 | Soldano |
| 7,616,050 B2 | 11/2009 | Eckstein |
| 8,300,440 B2 | 10/2012 | Ho et al. |
| 8,373,356 B2 | 2/2013 | Shao et al. |
| 9,148,929 B2 | 9/2015 | Jiang et al. |
| 2004/0109335 A1 | 6/2004 | Gan et al. |
| 2005/0035371 A1 | 2/2005 | Fujihira |
| 2005/0167749 A1 | 8/2005 | Disney |
| 2009/0016090 A1 | 1/2009 | Knight |
| 2009/0261790 A1 | 10/2009 | Arduini |
| 2010/0109561 A1 | 5/2010 | Chen et al. |
| 2010/0194445 A1 | 8/2010 | Balakrishnan et al. |
| 2011/0025278 A1 | 2/2011 | Balakrishnan et al. |
| 2011/0149615 A1 | 6/2011 | Matthews |
| 2012/0028093 A1 | 2/2012 | Jung |
| 2013/0020964 A1 | 1/2013 | Nuhfer et al. |
| 2015/0103567 A1* | 4/2015 | Wang ................ H02M 3/33592 363/21.13 |
| 2016/0141961 A1* | 5/2016 | Odell ................ H02M 3/33507 363/21.17 |
| 2017/0373595 A1* | 12/2017 | Huang ................ H02M 3/158 |

* cited by examiner

POWER CONVERTER CONTROLLER WITH STABILITY COMPENSATION

TECHNICAL FIELD

The present disclosure relates generally to power conversion circuits and methods of operation thereof. More specifically, the present disclosure relates to improved adaptive stability compensation in a power converter controller.

BACKGROUND

Most electronic devices such as cell phones, laptop computers, etc., use direct current (dc) power to operate. Conventional wall outlets generally deliver a high voltage alternating current (ac) power that needs to be transformed to do power in order to be used as a power source by most electronic devices. Switched mode power converters are commonly utilized to convert the high voltage ac power to a regulated dc power, due to their high efficiency, small size, and low weight. A switched mode power converter produces an output by periodically switching a power switch for one or more switching cycles.

Switched mode power converters typically employ a controller to regulate output power delivered to an electrical device, e.g., a battery, which is commonly referred to as a load. The controller regulates power to the load by controlling a power switch to repeatedly turn on and off in response to a feedback signal representative of the output of the power converter. A controller may use an on/off control technique to regulate an output of a switched mode power converter. In a typical on/off control technique, the controller determines whether to enable or disable the conduction of the power switch for each switching cycle by comparing the feedback signal with a threshold. For example, the controller may switch the power switch on (i.e., may initiate a switching activity) for the next switching cycle if the feedback signal is less than the threshold at the end of the previous switching cycle.

Switch mode power converters usually employ an output capacitor to smooth out any ripple in the output voltage. The output capacitor may be associated with a series resistance commonly referred to as an equivalent series resistance (ESR). In cases where the controller uses on/off control technique and the output capacitor has a small ESR, the feedback signal may not react quickly enough to effectuate the transfer of energy from the input to the output. For instance, the feedback signal may not cross the threshold quickly enough after the power switch is switched off in a switching cycle such that the power switch is switched on too soon after the previous switching activity. This can lead to grouping or bunching of switching activity that produces unstable operation of the power converter.

Additionally, in some cases, noise may couple to the feedback signal, such that the controller may not accurately detect the time that the feedback signal crosses the threshold. As a result, the controller may start mistiming the switching of the power switch, which can also cause instability in the power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
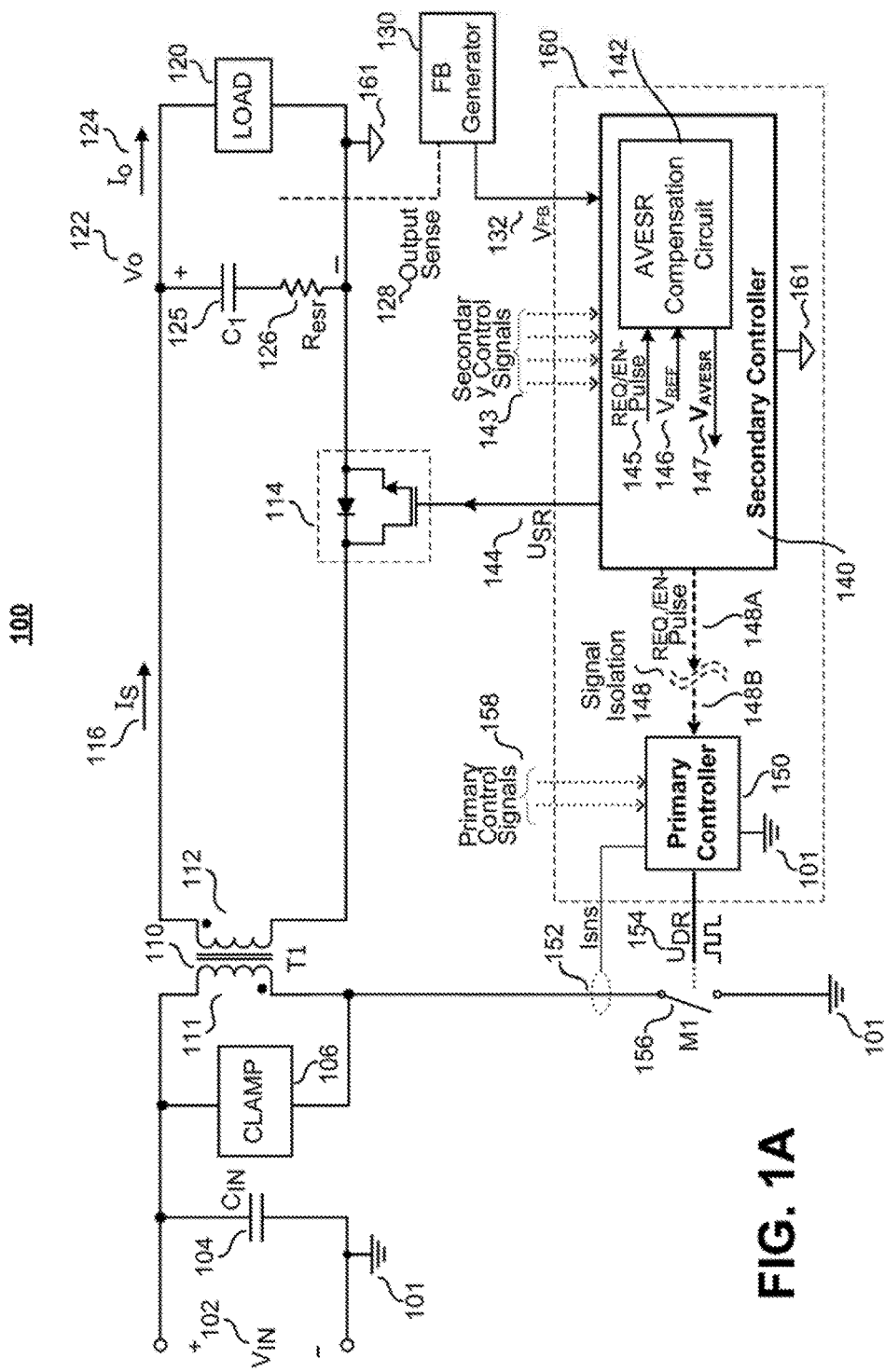
FIG. 1A is a circuit block diagram illustrating an example power converter with control compensation that utilizes an adaptive virtual ESR (AVESR).

Corresponding reference characters indicate corresponding components throughout the several views of the drawings. Skilled artisans will appreciate that elements in the figures are illustrated for simplicity and clarity and have not necessarily been drawn to scale. Also, common but well-understood elements that are useful or necessary in a commercially feasible embodiment may not be depicted in order to facilitate a less obstructed view of these various embodiments of the present disclosure.

DETAILED DESCRIPTION

In the following description numerous specific details are set forth in order to provide a thorough understanding of the present invention. It will be apparent, however, to one having ordinary skill in the art that the specific details need not be employed to practice the present invention. In other instances, well-known systems, devices, or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For purposes of this disclosure, "ground" or "ground potential" refers to a reference voltage or potential against which all other voltages or potentials of a circuit or integrated circuit (IC) are defined or measured.

An adaptive compensation control block for a feedback circuit for use in a power converter is described. In one embodiment, the adaptive compensation control block achieves a target level of compensation regardless of operating frequency and time period. The target level of compensation is achieved by adaptively controlling and adjusting a ramp parameter (e.g., slope) of a compensation ramp waveform. In other embodiments, adaptive compensation is achieved by fixing the slope and adaptively shifting (e.g., offsetting) the start point of the compensation ramp, or by adaptive time shifting of the fixed ramp compensation in a switching cycle.

FIG. 1A shows a schematic of an example power converter 100 which includes compensation circuit 142. In one embodiment, power converter 100 is a flyback power converter. As shown in FIG. 1A, power converter 100 is a switch mode power converter that uses an on/off control scheme to regulate an output signal, i.e., an output voltage $V_O$ 122, an output current $I_O$ 124, or combination of the two. Power converter 100 includes a synchronous rectification circuit 114, and a controller 160 coupled to receive a feedback FB signal $V_{FB}$ 132 generated by a FB generator 130 in response to an output sense signal 128 representative of the output signal (e.g., $V_O$ 122). In one embodiment, FB generator 130 may include a resistive divider coupled to the output of power converter 100 to generate feedback signal $V_{FB}$ 132, as a scaled-down voltage representative of output voltage $V_O$ 122. In one example, FB generator 130 is disposed on the same integrated circuit die as secondary controller 140.

Power converter 100 receives an unregulated input voltage $V_{IN}$ 102 and produces an output voltage $V_O$ 122 and an output current $I_O$ 124 delivered to an electrical load 120. Input voltage $V_{IN}$ 102 may be a rectified and filtered ac voltage. As shown, input voltage $V_{IN}$ 102 is referenced to a primary ground 101, also referred to as an input return. Output voltage $V_O$ 122 is referenced to a secondary ground 161, also referred to as an output return. In other examples, power converter 100 may have more than one output.

As further shown in FIG. 1A, controller 160 includes a primary controller 150 and a secondary controller 140 that controls the circuitry of power converter 100 so as to regulate the output signal (e.g., $V_O$ 122 or $I_O$ 124) at a desired level. In one example, power converter 100 may regulate output voltage $V_O$ 122 to the desired voltage level after a startup time period. The startup time period may be a period of time starting from when power converter 100 receives input voltage VI 102 until primary controller 150 and secondary controller 140 begin operating to regulate output voltage $V_O$ 122. In the example power converter 100, an output capacitor C1 125 is coupled to the output to smooth out the ripple in output voltage $V_O$ 122. In series with output capacitor C1 125 is a resistor $R_{esr}$ 126, which represents the equivalent series resistance (ESR) of output capacitor C1 125.

Also included in FIG. 1A is an energy transfer element T1 110 comprising a coupled inductor having a primary winding 111 and a secondary winding 112. Energy transfer element T1 110 functions to transfer energy from primary winding 111 to secondary winding 112. Additionally, energy transfer element T1 110 provides galvanic isolation between the circuitry on the primary side (input side) of power converter 100, and the circuitry on the secondary side (output side) of power converter 100. In other words, a dc voltage applied between the primary side (winding 111) and the secondary side (winding 112) of power converter 100 would produce substantially zero current.

Further shown in FIG. 1 is power switch M1 156 coupled to energy transfer element 110 at primary winding 111, and to input return 101. Power switching device M1 156 may comprise a metal oxide field effect transistor (MOSFET), a bipolar junction transistor (BJT), or the like. As shown, power switching device M1 156 is coupled to receive a drive signal $U_{DR}$ 154 output from primary controller 150. Secondary controller 140 is coupled to the circuitry on the secondary side, which includes a synchronous rectification circuit 114 and secondary winding 112. In operation, primary controller 150 provides drive signal $U_{DR}$ 154 to control power switching device M1 156, and secondary controller 140 outputs signal $U_{SR}$ 144 to control synchronous rectification circuit 114, thereby controlling energy transfer through energy transfer element T1 110 from the input to the output of power converter 100.

A clamp circuit 106 is coupled across primary winding 111 of energy transfer element T1 110. Clamp circuit 106 operates to clamp any turn-off signal spikes that may result from leakage inductance from primary winding 111 across the power switching device M1 156.

Primary controller 150 and secondary controller 140 may each be incorporated in an integrated circuit. In one embodiment, primary controller 150 is included in a first integrated circuit die and a secondary controller 140 is included in a second integrated circuit die that are both disposed in an integrated circuit package. In another embodiment, power switching device M1 156 may be included in a monolithic or hybrid structure of an integrated circuit package that also includes primary controller 150 and secondary controller 140. In one implementation, power switching device M1 156 is disposed on a first integrated circuit die that also includes primary controller 150 and secondary controller 140 is included in a second integrated circuit die. In another implementation, power switching device M1 156 is disposed on a first integrated circuit die, primary controller 150 is included in a second integrated circuit die, and secondary controller 140 is included in a third integrated circuit die. The die which includes primary controller 150 may be galvanically isolated from the die which includes secondary controller 140. Accordingly, primary controller 150 may be galvanically isolated from secondary controller 140.

In the case where primary controller 150 is galvanically isolated from secondary controller 140, a signal isolation link 148, which links secondary enable signal 148A output from secondary controller 140 with enable signal 148B input to primary controller 150, facilitates communication between the two controllers. In one example, secondary controller 140 may communicate with primary controller 150 by providing a signal through a magnetically coupled communication link (represented by signal isolation link 148). In another embodiment, a communication link between primary controller 150 and secondary controller 140 may be implemented using galvanically isolated conductive loops included in the lead frame of an integrated circuit package. Alternatively, signal isolation link 148 may be implemented through an optic-coupler, a capacitor, or a coupled inductor.

In the example of FIG. 1 secondary controller 140 transmits an enabling signal REQ/EN-pulse 148A which is received by primary controller 150 through signal isolation link 148 as REQ/EN-pulse signal 148B. Primary controller 150 controls the on/off state of power switching device M1 156 in response to REQ/EN-pulse signal 148B. Switching activity of power switching device M1 156 in transition from OFF state (e.g., as an open switch) to an ON state (e.g., as a closed switch) depends on a drive signal $U_{DR}$ 154 generated by primary controller 150 in response to enabling signal REQ/EN-pulse 148B. In operation, primary controller 150 controls transfer of energy from input to output of power converter by sensing current in, 152 flowing in power switching device M1 156 and primary winding 111. Primary controller 150 controls the turn-off of power switching device M1 156 through a current limit in response to the output load demand. The primary controller 150 may also receive some primary control signals 158 to generate drive signal $U_{DR}$154.

As shown, secondary controller 140 is referenced to output return 161 and may also receive secondary control signals 143 (in addition to feedback signal $V_{FB}$ 132) to generate SR drive signal $U_{SR}$ 144, as well as REQ/EN-pulse signal 148A for transmission to primary controller 150. In the example of FIG. 1A secondary controller 140 includes an adaptive virtual ESR circuit block 142 that receives feedback reference signal $V_{FB}$ 132, feedback reference signal $V_{REF}$ 146, and REQ/EN-pulse signal 145 to generate an adaptive virtual ESR signal $V_{AVESR}$ 147 that provides compensation to improve stability and prevent pulse grouping (pulse bunching). That is, FB reference signal $V_{ref}$ 146 is compensated in comparison to FB signal $V_{FB}$ 132 to regulate transfer of energy from input to output. Persons of skill in the art will appreciate that FB loop compensation may be achieved either by compensating the FB signal $V_{FB}$ 132 or by compensating the FB reference signal $V_{REF}$ 146, as illustrated by the simplified FB comparators shown in FIG. 1B and FIG. 1C (discussed below).

Adaptive virtual ESR (AVESR) compensation circuit block 142 is coupled to output a compensation ramp signal $V_{AVESR}$ 147 (as the compensated feedback reference signal) in response to the reference signal $V_{REF}$ 146. The AVESR compensation circuit 142 also receives REQ/EN-pulse signal 145 which is a synchronizing signal that enables primary switch turn-on. Persons of skill in the art will appreciate that other synchronizing signals (e.g., secondary current signal from $I_S$ 116) may be utilized in other embodiments.

It is appreciated that secondary current $I_S$ 116 is substantially zero when power switching device M1 156 is in the ON state. When power switching device M1 156 transitions to the OFF state and primary winding 111 starts transferring energy to secondary winding 112, current $I_S$ 116 becomes non-zero.

Continuing with the description of FIG. 1A, when power switching device M1 156 is in the ON state, the current flowing through primary winding 110 increases the energy stored in energy transfer element T1 110. A primary winding voltage with a first polarity develops across primary winding 111. Due to reverse direction of secondary winding 112, as compared to primary winding 111, a secondary winding voltage with an opposite polarity of the primary winding voltage develops across secondary winding 112. Synchronous rectification circuit 114 functions as an open circuit when the voltage at the dotted end of secondary winding 112 is less than the voltage at the opposite end of winding 112.

Primary controller 150 is configured to generate output $U_{DR}$ signal 154, which transitions power switching device M1 156 from the ON state to the OFF state when the current through primary winding 111 reaches a current limit. In one embodiment the current limit may be a specified, fixed limit. In other embodiments, the current limit may be an adjustable or adaptive variable current limit which blocks current flow through power switching device M1 156. When power switching device M1 156 transitions from the ON state to the OFF state, the voltage at the dotted end of secondary winding 112 becomes greater than the voltage at the opposite end, which allows energy to be transferred to output capacitor C1 125, thereby providing power to electrical load 120.

In one example, secondary controller 140 may control synchronous rectification circuit (synchronous switch) 114 through control signal $U_{SR}$ 144 to function as a closed switch (i.e., to conduct current) when the voltage at the dotted end of secondary winding 112 becomes greater than the voltage at opposite end, such that output capacitor C1 125 is charged.

In one implementation, synchronous switch 114 comprises a MOSFET having a gate coupled to receive control signal $U_{SR}$ 144. Synchronous switch 114 may operate in the ON state (i.e., the switch is turned ON) or in the OFF state (i.e., the switch is turned OFF) depending on the value of control signal $U_{SR}$ 144. When turned ON, synchronous rectification circuit 114 conducts current. In the illustrated example, synchronous rectification circuit 114 also includes a diode, coupled between the source and drain of the MOSFET. The diode may be implemented as a discrete component, or as a body diode of the MOSFET.

In one example of secondary controller 140, AVESR compensation circuit 142 synchronizes the compensation ramp with signal REQEN-pulse 148A that is enabling drive signal $U_{DR}$ for primary power switching device M1 156. However; it is appreciated that other circuit signals could be also be used for that purpose. For example, control signal $U_{SR}$ 144 may be utilized to activate and synchronize the compensation circuit signals received by AVESR compensation circuit 142. In another example, the compensation signals may be synchronized with the secondary current signal $I_S$ 116. As shown in the example of FIG. 1, AVESR compensation circuit 142 utilizes and synchronizes with the enabling signal (REQ/EN-pulse 148A) generated by secondary controller 140 to drive primary power switching device M1 156 via primary controller 150.

In operation, enable signal REQ/EN-pulse 148A is set by comparison of feedback signal $V_{FB}$ 132 with a threshold, i.e., feedback reference signal $V_{REF}$ 146, to set REQ/EN-pulse 148A (logic high or logic low) in order to control the switching of power switching device M1 156 through primary controller 150. For instance, if feedback signal $V_{FB}$ 132 is less than feedback reference signal $V_{REF}$ 146, indicating an output signal (e.g., $V_o$ 122 or $I_o$ 124) having a value below a desired level, REQ/EN-pulse signal 148A is set to logic high, which indicates to primary controller 150 that power switching device M1 156 should be transitioned to the ON state so that more energy can be stored in the primary winding 111 and then transferred to the output of power converter 100 the next time power switching device M1 156 is transitioned to the OFF state. In one embodiment power switching device M1 may transition to the OFF state by a current limit control such that no more energy is stored in the primary winding 111 to be delivered to the output of power converter 100. The drive signal $U_{DR}$ 154 controls the operation of power switch M1 156.

In one embodiment, after power switching device M1 156 transitions to the OFF state, for a threshold period (also referred to as a hold-off period) feedback circuit is not responsive to the feedback signal $V_{FB}$ 132. That is, the logic level of REQ/EN-pulse signal 148A is not changed during the hold-off period.

Power converter 100 may be configured to operate in a continuous conduction mode, which may be desirable for driving larger loads. In continuous conduction mode, the switch of synchronous rectification circuit 114 is turned ON during the entire time that power switching device M1 156 is in the OFF state. At lighter loads, power converter 100 typically operates in a discontinuous conduction mode, wherein the switch of synchronous rectification circuit 114 is turned ON for a fractional portion of the time that power switching device M1 156 is OFF.

Person of skill will understand that in the absence of adaptive virtual ESR compensation circuit 142 when output capacitor C1 125 has an associated ESR 126 that is relatively small, output sense signal 128 (hence, feedback signal $V_{FB}$ 130) may not react quickly enough to the changes caused by synchronous rectification circuit 114 while operating in continuous conduction mode. For example, when the MOSFET of synchronous rectification circuit 114 is turned ON, after power switching device M1 156 transitions to the OFF state, feedback signal $V_{FB}$ 132 may not rise quickly enough to cross the determined threshold by the end of the hold-off period. This can cause secondary controller 140 to command primary controller 150 (by setting enable signal EN-pulse 148A) to transition power switching device M1 156 to the ON state as soon as the hold-off period is over. As a result, power switching device M1 156 may switch to the ON state too soon after the previous switching activity. This may lead to a pattern of grouped pulses in drive signal $U_{DR}$ 154 where several periods of switching activity will be followed by periods of no switching activity and therefore, unstable operation of power converter 100.

Persons of skill in the art will further appreciate that a similar problem may occur when noise coupled to feedback signal $V_{FB}$ 132 during the time when power converter 100 is operating in the discontinuous conduction mode. In either case, utilizing adaptive virtual ESR compensation circuit 142, either feedback signal $V_{FB}$ 130 or feedback reference signal $V_{REF}$ 146 can be altered or compensated to mitigate the problem of grouped pulses. In other words, adaptive virtual ESR compensation circuit 142 provides the advantage of stable operation and improved functionality of power converter 100.

Figure 1C:
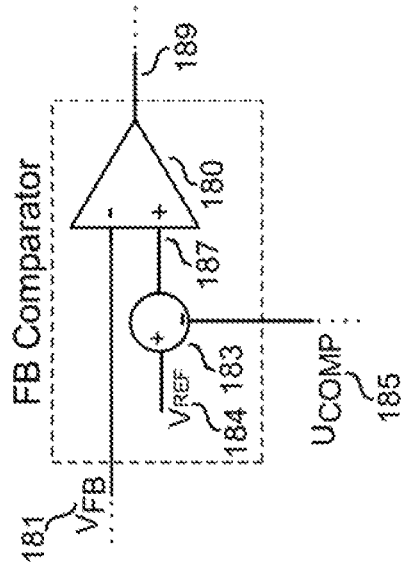
FIG. 1C is another example circuit diagram showing the use of an adaptive virtual ESR signal which compensates a feedback signal.
Figure 1B:
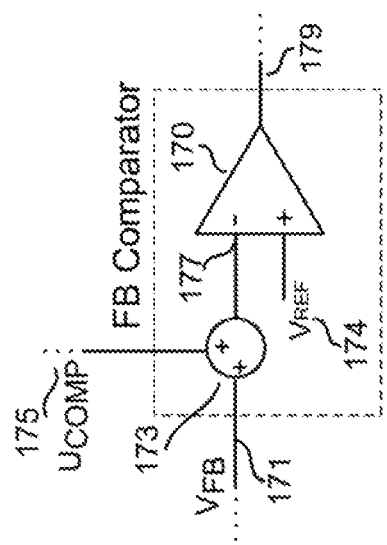
FIG. 1B is an example circuit diagram showing the use of an adaptive virtual ESR signal which compensates a feedback signal.

FIGS. 1B and 1C show two examples of different ways of implementing an adaptive virtual ESR compensation circuit. In FIG. 1B a compensation signal $U_{COMP}$ 175 is added to feedback signal $V_{FB}$ 171, whereas in FIG. 1C a compensation signal $U_{COMP}$ 185 is subtracted from reference signal $V_{REF}$ 184. In the example circuit of FIG. 1B a summation block 173 sums compensation signal $U_{COMP}$ 175 and feedback signal $V_{FB}$ 171. The summed signal 177, which may be referred to as a compensated feedback signal or a compensated output sense signal, is shown applied to the negative input of a feedback comparator 170. The positive input of comparator 170 receives feedback reference signal $V_{REF}$ 174. In one example, comparator 170 is an ON-OFF feedback comparator. Summation block 173 is coupled to receive compensation signal $U_{COMP}$ 175 and feedback signal $V_{FB}$ 171. Summation block 173 adds compensation signal $U_{COMP}$ 175 to feedback signal feedback $V_{FB}$ 171 and provides the resulting signal 177 to the negative input terminal of comparator 170.

In the example of FIG. 1B, compensated feedback signal 177 is representative of a signal that is higher than feedback signal $V_{FB}$ 171 (presenting the desired output voltage of power converter 100) during at least a part of a time that the output capacitance is being charged. The positive input terminal of comparator 170 is coupled to receive a reference signal $V_{REF}$ 174. Comparator 170 is configured to output a comparison result signal 179, which is utilized to set REQ/EN-pulse 148A based on the comparison between reference signal $V_{REF}$ 174 and compensated feedback signal 177. In one embodiment, the difference between compensated feedback signal 177 and the desired output voltage of power converter 100 decreases continuously in time. In one embodiment, this difference decreases substantially linearly in time. In another embodiment, this difference may decrease substantially exponentially in time.

In FIG. 1C subtraction block 183 subtracts compensation signal $U_{COMP}$ 185 from reference signal $V_{REF}$ 184. The resulting signal 187, which may be referred to as a compensated reference signal, is shown applied to the positive input of a comparator 180. In the example of FIG. 1C, compensation signal $U_{COMP}$ 185 is subtracted from reference signal $V_{REF}$ 184 to generate signal 187 at the positive input of comparator 180. Compensated reference signal 187 may simulate an adaptive virtual ESR signal used to generate the desired output voltage of power converter 100.

The negative input terminal of comparator 180 is coupled to receive feedback signal $V_{FB}$ 181. Thus, comparator 180 is configured to compare compensated reference signal 187 with the feedback signal $V_{FB}$ 181 and output a comparison result signal 189. Comparison result signal 189 may be used to set REQ/EN-pulse signal 148A to one of two logic levels based on the comparison of feedback signal $V_{FB}$ 181 with compensated reference signal 187. In one embodiment, the difference between the feedback signal $V_{FB}$ 181 and compensated reference signal 187 decreases continuously in time. In one embodiment, this difference decreases substantially linearly in time. In another example, this difference may decrease substantially exponentially in time.

Figure 2A:
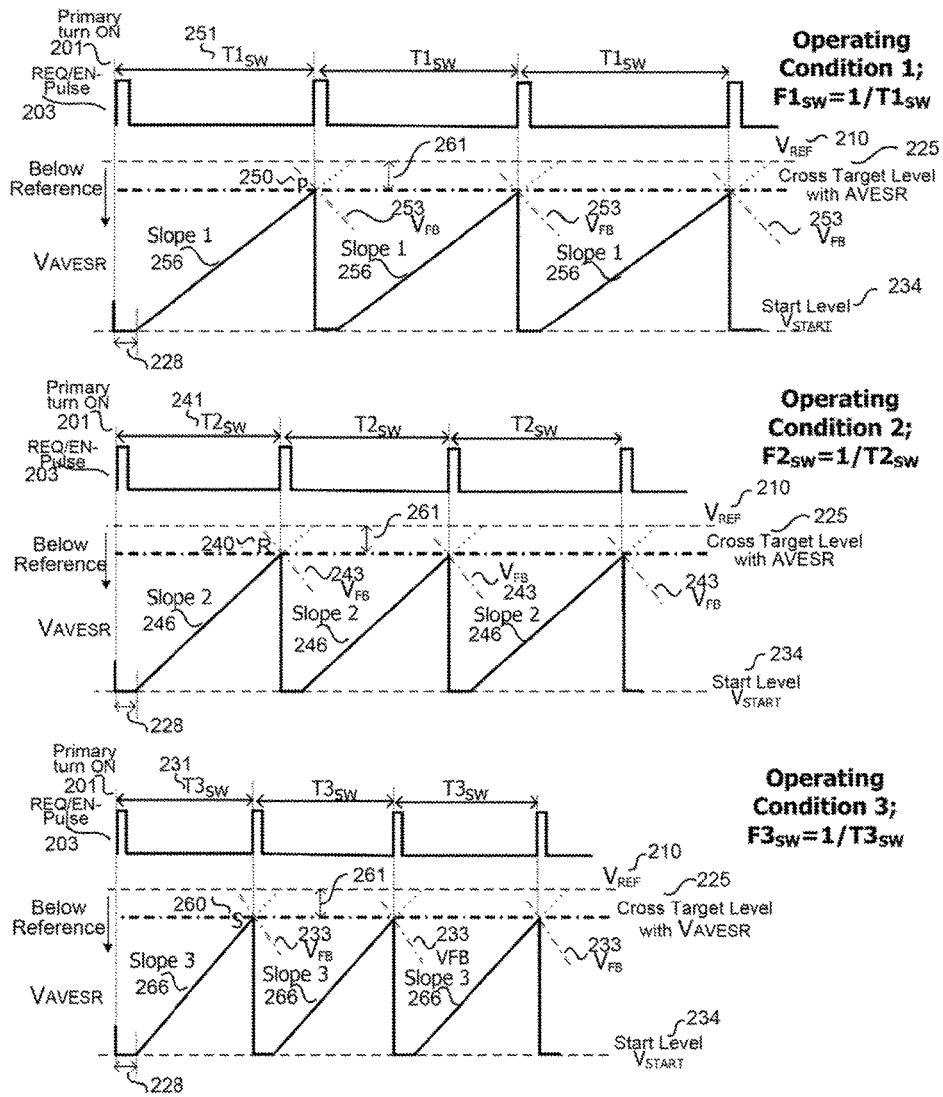
FIGS. 2A-2B are waveform diagrams that illustrate examples of adaptive virtual ESR compensation as utilized in a power converter controller.
Figure 2B:
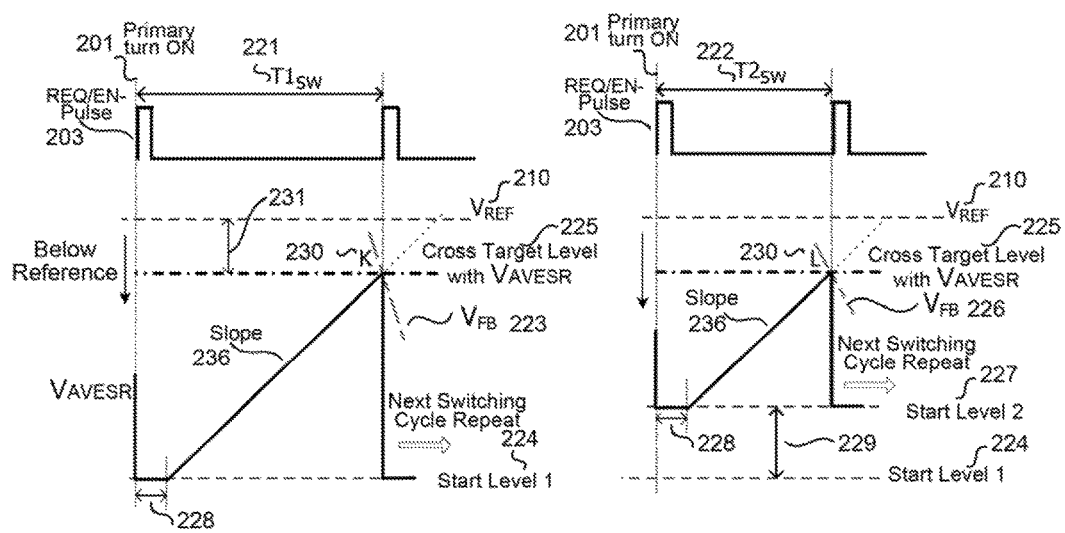

FIGS. 2A-2B are waveform diagrams that illustrate different ways that adaptive virtual ESR compensation may be utilized in a power converter controller. FIG. 2A shows waveform diagrams of an embodiment that implements adaptive virtual ESR compensation by controlling the ramp slope. FIG. 2A illustrates three different load and line operating conditions wherein switching frequency is increasing from $F1_{sw}=1/T1_{sw}$ to $F2_{sw}=1/T2_{sw}$ and to $F3_{sw}=1/T3_{sw}$. As can be seen, at operating condition 1, with switching period $T1_{sw}$ 251 (switching frequency $F1_{sw}=1/T1_{sw}$), the compensation ramp starts ramping up from start voltage level 234 after a brief hold-off delay time 228. Hold-off delay time 228 may include some reset time at the beginning of each switching cycle/period. In operating condition 1, slope 1 256 of the compensation ramp waveform has a crossing point P 250 with the feedback signal line $V_{FB}$ 253 at the cross target level 225, which is below reference level $V_{REF}$ 210 by a margin or difference 261, which, in one embodiment, may go as low as zero.

When load or line condition changes in operating condition 2 (e.g., load increases) the switching period reduces to $T2_{sw}$ 241 (switching frequency $F2_{sw}=1/T2_{sw}$). As a result of adaptive compensation of virtual ESR, the compensation ramp waveform changes slope (after hold-off delay 228) and starts ramping from start voltage level 234 with slope 2 246, which is steeper than slope 1 256. As shown, in operating condition 2, slope 2 246 of the compensation ramp waveform has a crossing point R 240 with feedback signal line 243 at a desired cross target level 225 (with margin 261 below reference level $V_{REF}$ 210).

In operating condition 3 the load increases further, such that the switching period reduces to $T3_{sw}$ 231 (switching frequency $F3_{sw}=1/T3_{sw}$). As a result of adaptive compensation of virtual ESR, the compensation ramp waveform changes slope (after hold-off delay 228) and starts ramping from start voltage level 234 with a further increased slope 3 266. As shown, slope 3 266 of the compensation ramp waveform has a crossing point S 260 with feedback signal line $V_{FB}$ 243 at desired cross target level 225 (with margin 261 below reference level $V_{REF}$ 210).

FIG. 2B shows example waveform diagrams of another embodiment of an adaptive virtual ESR compensation wherein a slope 236 of the ramp waveform does not change, but the start level of the compensation ramp moves up and down responsive to different load (or line) conditions such that the cross point of the feedback signal line ($V_{FB}$ 223 on the left-side diagram and $V_{FB}$ 226 on the right-side) with the compensation ramp occurs at the same cross target level 225 with $V_{AVESR}$. In a load condition with switching period $T1_{sw}$ 221 ($F1_{sw}=1/T1_{sw}$), at the rising edge 201 of REQ/EN-pulse signal 203 (at the moment primary switch turns ON) the compensation ramp rises with slope 236. At cross point K 230 of the compensation ramp waveform with feedback signal line $V_{FB}$ 223, the next switching cycle is initiated. The cross target level 225 with $V_{AVESR}$, which defines the regulated output voltage, is below the reference level $V_{REF}$ 210 by a margin 231. When the load condition and switching frequency changes (e.g., frequency is increased from $F1_{sw}=1/T1_{sw}$ to $F2_{sw}=1/T2_{sw}$ as a result of load increase) the start voltage level is adaptively adjusted from start voltage level 1 224 to start level 2 227. Therefore, the cross point L 230 of the compensation ramp with the feedback signal line $V_{FB}$ 236 is kept on the same cross target level 225 such that the resulted regulated output voltage remains substantially constant.

Figure 3:
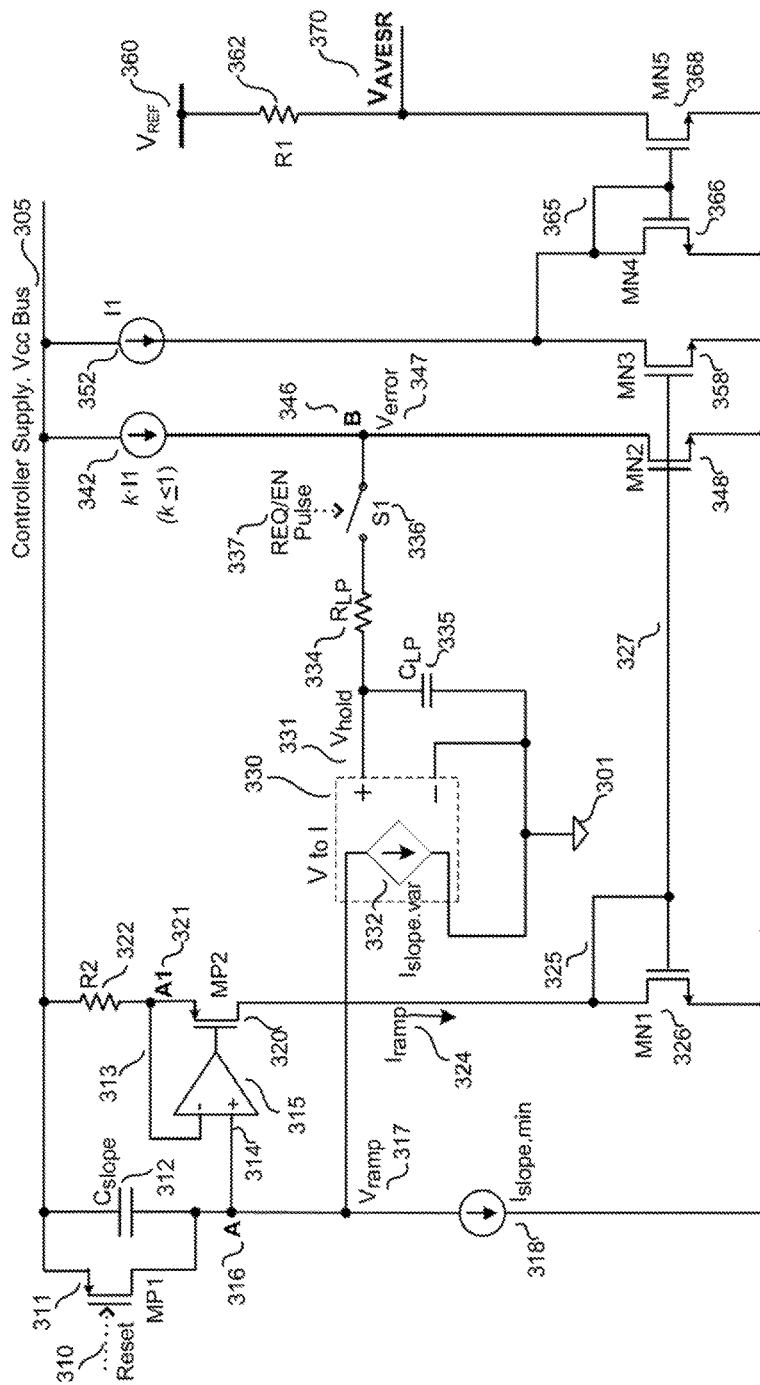
FIG. 3 is an example circuit schematic diagram for implementing adaptive virtual ESR compensation for use in a power converter controller.

FIG. 3 is an example circuit schematic diagram for implementing adaptive virtual ESR compensation for use in a power converter controller. In this example circuit a preselected minimum shallow slope may be generated by a minimum current source $I_{slope-min}$ 318 that may be adaptively increased to adjust a ramp slope towards a final slope such that the ramp slope of $V_{AVESR}$ 370 arrives at a fixed target level. Increasing the ramp slope is achieved in this example by adding a voltage controlled current source, V-to-I 330 to the minimum current source $I_{slope-min}$ 318 in response to the integration of previous switching cycles of ramp slopes and their high threshold crossing points. The functions of the various devices and components shown in FIG. 3 are explained below with reference to the waveform signal diagram of FIG. 4.

As shown in FIG. 3, a slope capacitor $C_{slope}$ 312 is coupled to controller supply bus $V_{CC}$ 305. As long as PMOS switch MP1 311 (shown coupled across capacitor $C_{slope}$ 312) is not activated by reset signal 310 (waveform 430 of FIG. 4), capacitor $C_{slope}$ 312 is charged linearly by the current source $I_{slope-min}$ 318. Reset signal 310 is synchronized in each switching cycle with the falling edge of enabling signal (reset signal 430 waveform and REQ/EN-pulse 420 waveform of FIG. 4, respectively). When reset signal 310 is at a logic low level, PMOS switch MP1 311 closes (turns-on) thereby connecting node A 316 to $V_{CC}$ bus 305.

As shown, operational amplifier 315 is configured as a voltage follower, with the voltage at node A1 321 following voltage at node A 316, i.e., $V_{ramp}$ 317. The output of operational amplifier 315 is coupled to the gate of PMOS switch MP2 320. The positive input 314 of operational amplifier 315 is coupled to node A 316, with the negative input 313 being coupled to node A1 321 (source of MP2 320), which is coupled to $V_{CC}$ bus 305 through resistor R2 322. During the reset time when MP1 311 is turned ON, capacitor $C_{slope}$ 312 is shorted, thereby discharging it. Node A 316 is thus pulled to $V_{CC}$ bus 305. In other words, during discharge of capacitor $C_{slope}$ 312 (reset interval) no current flows through NMOS switch MN1 326, which is connected as a diode through link 325 across its gate to drain. Other than the reset interval (interval 432 in waveform 430 of FIG. 4; t2 402 to t3 403) the diode-connected NMOS switch MN1 326 conducts current $I_{ramp}$ 324 that is calculated as: $I_{ramp}=(V_{CC}-V_{ramp})/R2$.

The example circuit diagram of FIG. 3 also shows current $I_{ramp}$ 324 mirrored to NMOS switches MN2 348 and MN3 358, which share a common gate signal 327 with MN1 326. Current source 352 has a value of I1 that presents a high current threshold for the ramp current $I_{ramp}$ 324. As long as the ramp current $I_{ramp}$ 324 (reflected/mirrored in current of MN3 358) is below the threshold of I1 352, switch MN4 366 conducts. Current flowing through switch MN4 366 (I1−$I_{ramp}$) is mirrored to switch MN5 368. The voltage drop on resistor R1 362, shown coupled to the reference voltage bus $V_{REF}$ 360, generates a voltage signal $V_{AVESR}$ 370 at the output of AVESR compensation circuit block (e.g., signal 147 of FIG. 1A): $V_{AVESR}=V_{REF}-(I1-I_{ramp})\times R1)$. When the ramp current $I_{ramp}$ 324 exceeds the threshold I1 352 switch MN4 366 stops conducting. Thus, all the current I1 352 is conducted through switch MN4 366 and mirrored on switch MN5 368, thereby generating a voltage signal $V_{AVESR}=V_{REF}$.

As discussed above, the slope control accomplished through increasing the charging current of $C_{slope}$ 312 by adding variable current source $I_{slope-var}$ 332 at node A 316. The increase in charging current is defined by the transfer function of voltage controlled current source V-to-I 330. Voltage $V_{hold}$ 331 at the input of V-to-I 330 appears across capacitor $C_{LP}$ 335, and is provided from node B 346 through switch S1 336 and low-pass filter consisting of $R_{LP}$ 334 and $C_{LP}$ 335. The control signal that closes switch S1 336 is provided through REQ/EN-pulse signal 337, which may be generated in the secondary controller to turn-on the primary power switch (secondary controller 140 and power switching device M1 156, respectively, in FIG. 1A).

Persons of skill in the art will understand that as long as the mirrored current $I_{ramp}$ 324 in switch MN2 348 is below a pre-threshold k·I1 (I1 is the high threshold current source 352 and factor k is less than or equal to one, k ≤1), the additional current from current source k·I1 342 may charge capacitor $C_{LP}$ 335 during short closing intervals of switch S1 336. This results in increase of current $I_{slope-var}$ 332, which results in an increase of the charging current slope of capacitor $C_{slope}$ 312. However, during major period of switching cycle when REQ/EN-pulse signal 337 is low (switch S1 336 open), holding voltage $V_{hold}$ 331 across capacitor $C_{LP}$ 335 remains substantially constant or unchanged. Thus, in successive switching cycles capacitor $C_{LP}$ 335 integrates the error voltage $V_{error}$ 347 change during the charging intervals (e.g., interval t4 404 to t5 405 of FIG. 4). On the other hand, when the ramp current $I_{ramp}$ 324 exceeds the pre-threshold of k·I1, the error voltage $V_{error}$ 347 at node B 346 is pulled down to ground 301. This means that during the closing interval of switch S1 336 (REQ/EN-pulse signal 337 logic high) the voltage $V_{hold}$ 331 appearing across capacitor $C_{LP}$ 335 discharges. The discharge of capacitor $C_{LP}$ 335 reduces current $I_{slope-var}$ 332, which, in turn, reduces the charging current slope of capacitor $C_{slope}$ 312.

Note that NMOS switch MN3 358 conducts the mirrored current $I_{ramp}$ 324. The subtraction of ramp current $I_{ramp}$ 324 from the threshold current source I1 352 (I1−$I_{ramp}$) flows through diode-connected NMOS switch MN4 366, which current is mirrored through MN5 368. Output voltage signal $V_{AVESR}$ 370, which provides the slope change of the adaptive virtual ESR, is defined as: $V_{AVESR}=V_{REF}-R1\times(I1-I_{ramp})$.

Figure 4:
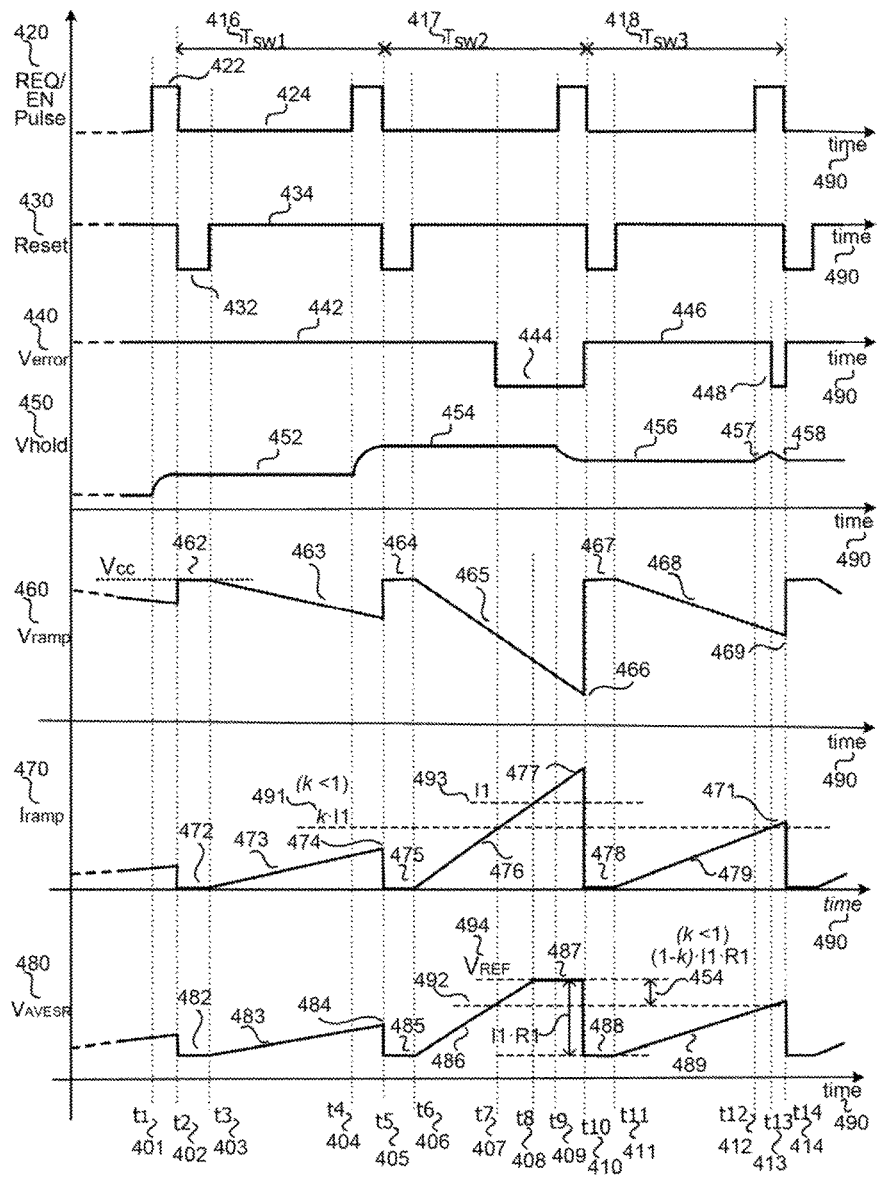
FIG. 4 is an example waveform timing diagram of various signals generated during operation of the example circuit shown in FIG. 3.

FIG. 4 illustrates signal waveforms versus time 490 (horizontal axis) at different nodes of the example AVESR circuit schematic diagram shown in FIG. 3. Waveform 420 is the REQ/EN-pulse signal (e.g., 148A or 148B in FIG. 1A) transferred from secondary controller 140 to primary controller 150 to command turn-on of the primary power switching device M1 156. In each switching cycle $T_{sw}$ 416 the turn-on request for primary power switching device M1 156 is initiated by a short interval of logic high 422 followed by logic low 424 that extends till next switching cycle. In the OFF-ON control technique, the primary power switching device M1 156 turn-off command is produced through a current limit for the power switch sensed current $I_{sns}$ 152 that may be adjusted by a control loop based on the output load demand.

Waveform 430 shows the reset signal, which is the activation signal (310 for PMOS switch MP1 311 across $C_{slope}$ 312 in FIG. 3). With reference to FIG. 3, during the logic low period 432 PMOS switch MP1 311 is closed to discharge $C_{slope}$ 312 and to reset for a new period of charging. During the logic high period 434, switch MP1 311 is open and $C_{slope}$ 312 charges with current $I_{slope-min}$ 318 plus $I_{slope-var}$ 332.

Three switching cycles $T_{sw1}$ 416, $T_{sw2}$ 417 and $T_{sw3}$ 418 are provided in FIG. 4 to show how the slope of the compensated feedback reference signal may be adaptively changed to ramp up each time to the desired potential level for improved and accurate voltage regulation. In the first switching cycle $T_{sw1}$ 416 the resulting compensation ramp slope (e.g., waveform $V_{AVESR}$ 480, ramp 483) is not steep enough and did not reach the desired potential level. In the second switching cycle $T_{sw2}$ 417 the ramp slope (e.g., waveform $V_{AVESR}$ 480, ramp 486) has increased to the point of overshooting beyond the desired potential level. The third switching cycle $T_{sw3}$ 418 shows the adaptively adjusted ramp slope (e.g., waveform $V_{AVESR}$ 480, ramp 486) that ideally reaches the desired potential level. It is appreciated that in accordance with the circuits and methods of the present disclosure, the desired ramp slope may be achieved in several switching cycles without overshoot or instability.

Waveform 440 shows the error voltage signal $V_{error}$ 347 at node B 346 of FIG. 3. Referring back to FIG. 3, when $I_{ramp}$ 324 is less than k·I1 switch MN2 348 conducts the mirrored current $I_{ramp}$ 324, and the extra current from current source k·I1 342 may charge capacitor $C_{LP}$ 335 during closing intervals of switch S1 336. As long as $I_{ramp}$ 324 is less than k·I1, the signal $V_{error}$ 347 is pulled up to voltage level 442. When $I_{ramp}$ 324 goes above k·I1 the voltage signal $V_{error}$ 347 is pulled low to ground level 444. As shown in waveform 440, during the first switching cycle $T_{sw1}$ 316, $V_{error}$ remains high. During the second switching cycle $T_{w2}$ 317, $I_{ramp}$ exceeds k·I1 such that the signal $V_{error}$ drops low to level 444 during time interval t7 407 to t10 410. When $I_{ramp}$ again drops below k·I1, in interval t10 410 to t13 413, the signal $V_{error}$ is at logic high level 446. In the third switching cycle $T_{sw3}$ 318 $I_{ramp}$ briefly hits the pre-threshold limit k·I1; the $V_{error}$ waveform shows a narrow dropping pulse to low level 448.

Waveform $V_{hold}$ 450 shows the holding voltage across capacitor $C_{-LP}$ that generates the variable slope current $I_{slope.var}$ (332 in FIG. 3). In the major part of the switching cycle, when switch S1 336 is open, the $V_{-hold}$ voltage across $C_{LP}$ is held with substantially no change. When switch S1 336 is activated and closes via the narrow REQ/EN-pulse signal, the capacitor $C_{LP}$ is charged from level 453 to level 454 in interval t4 404 to t5 405 (while $I_{ramp}$ remains below the pre-threshold level k·I1). Capacitor $C_{LP}$ may be discharged from level 454 to level 456 in interval t9 409 to t10 410 (while $I_{ramp}$ is above the pre-threshold level k·I1). Note that in time interval t12 412 to t14 414 $I_{ramp}$ briefly reaches the pre-threshold k·I1; i.e., waveform $V_{hold}$ shows a small bump 457/458.

Waveform $V_{ramp}$ 460 shows the signal for ramp voltage ($V_{ramp}$ 317 at node 316 of FIG. 3). As shown, during reset period 432 (t2, 402 to t3, 403), the ramp voltage $V_{ramp}$ level is pulled up to voltage level 462 (e.g., $V_{CC}$ bus voltage). The required reset periods (time intervals) that are shown on graphs 460, 470 and 480 of FIG. 4 are included in the delay hold off time shown on compensation ramps of FIG. 2A and FIG. 2B. As long as signal $V_{hold}$ remains on a flat level 452 (t3, 403 to t4, 404) the ramp voltage ramps down with a slope 463 proportional to the holding voltage level 452. At the next REQ/EN-pulse signal (t4, 404 to t5 405) in the second switching cycle $T_{sw2}$ 417, capacitor $C_{LP}$ is charged and the holding voltage $V_{hold}$ 450 increases to a higher level 454. In this switching cycle after the reset interval of 464 the voltage $V_{ramp}$ ramps down with a steeper slope 465 down to a minimum voltage level 466.

In third switching cycle $T_{-sw3}$ 418, after the reset interval 467 (t10 to t11) the slope 468 of $V_{ramp}$ is adjusted back to a milder slope 468, reaching to a minimum voltage level 469. The reason why is because $I_{ramp}$ has exceeded the pre-threshold k·I1 and capacitor $C_{LP}$ ($V_{hold}$) was discharged (during REQ/EN-pulse signal, t9 to t10) to a lower voltage level 456. Thus, by an integrating function of $V_{hold}$ the ramp slope is adjusted to adaptively reach a desired pre-threshold level.

Waveform $I_{ramp}$ 470 shows the signal of the ramping current $I_{ramp}$ (324 in FIG. 3), which remains at zero level during reset signal 310 logic low, intervals 472, 475 and 478 (t2 402 to t3 403, t5 405 to t6 406 and t10 410 to t11 411, respectively). The reason why is because when PMOS switch MP1 is turned on (see FIG. 3) to discharge (reset) slope capacitor $C_{slope}$ 312, the potential on node A 316, as well as node A1 321, are at the same potential of $V_{CC}$ bus 305, and no current flows through resistor R2 322. After the reset interval, while the PMOS MP2 320 is turned on and voltage at node A1 321 is below $V_{CC}$ bus 305 voltage, the $I_{ramp}$ signal 470 ramps up linearly.

In first switching cycle $T_{sw1}$ 316 the ramp up slope 473 is relatively slow, and peak current 474 at t5 405 remains below current pre-threshold k·I1 491. In second switching cycle $T_{sw2}$ 417 the ramp up slope 476 is very fast and $I_{ramp}$ hits both the pre-threshold k·I1 491 (at t7 407) and threshold I1 493 (at t8 408) and continues to a peak value 477 (at t10 410). In third switching cycle $T_{-sw3}$ 318 the ramp up slope 479 has been adjusted by AVESR circuit block to the desired value and $I_{ramp}$ slope 479 mildly hits the pre-threshold k·I1 491 (at t13 413) with a peak value 471 slightly above pre-threshold k·I1 491. The slope for next switching periods would be locked on this desired slope. As discussed above, $I_{ramp}$ 470 waveform shows a reverse slope of $V_{ramp}$ as defined by: $I_{ramp}=(V_{CC}-V_{ramp})/R2$.

Waveform 480 shows the adaptive virtual ESR signal $V_{AVESR}$ generated by the circuit blocks of FIG. 3. During reset intervals 482 (t2 402 to t3403), 485 (t5 405 to t6 406) and 488 (t10, 410 to t11, 411) $V_{AVESR}$ stays flat. In first switching cycle $T_{sw1}$ 416 after reset interval 482 the voltage $V_{AVESR}$ ramps up with a relatively slow slope 483 up to a peak value 484 (at t5 405) that is below the pre-threshold voltage (i.e., the target voltage), $V_{REF}-(1-k)\cdot I1\cdot R1$. In the second switching cycle $T_{sw2}$ 417 the ramp up slope 486 is very fast and voltage signal $V_{AVESR}$ reaches the voltage pre-threshold 492 (at t7, 407). When the $V_{AVESR}$ voltage signal ramp continues and reaches the reference voltage level $V_{REF}$ 494 (at t8 408) it is clamped at $V_{REF}$ level 487 between t8 408 to t10 410. Finally, during the third switching cycle $T_{sw3}$ 418 the $I_{ramp}$ slope is adjusted by the control circuit block of adaptive virtual ESR (AVESR) to an optimal value such that the ramp up slope 489 adaptively reaches a target/desired peak value 491 around pre-threshold level 492 (at t14, 414). The slope for next switching periods is then locked on this desired slope.

Figure 5:
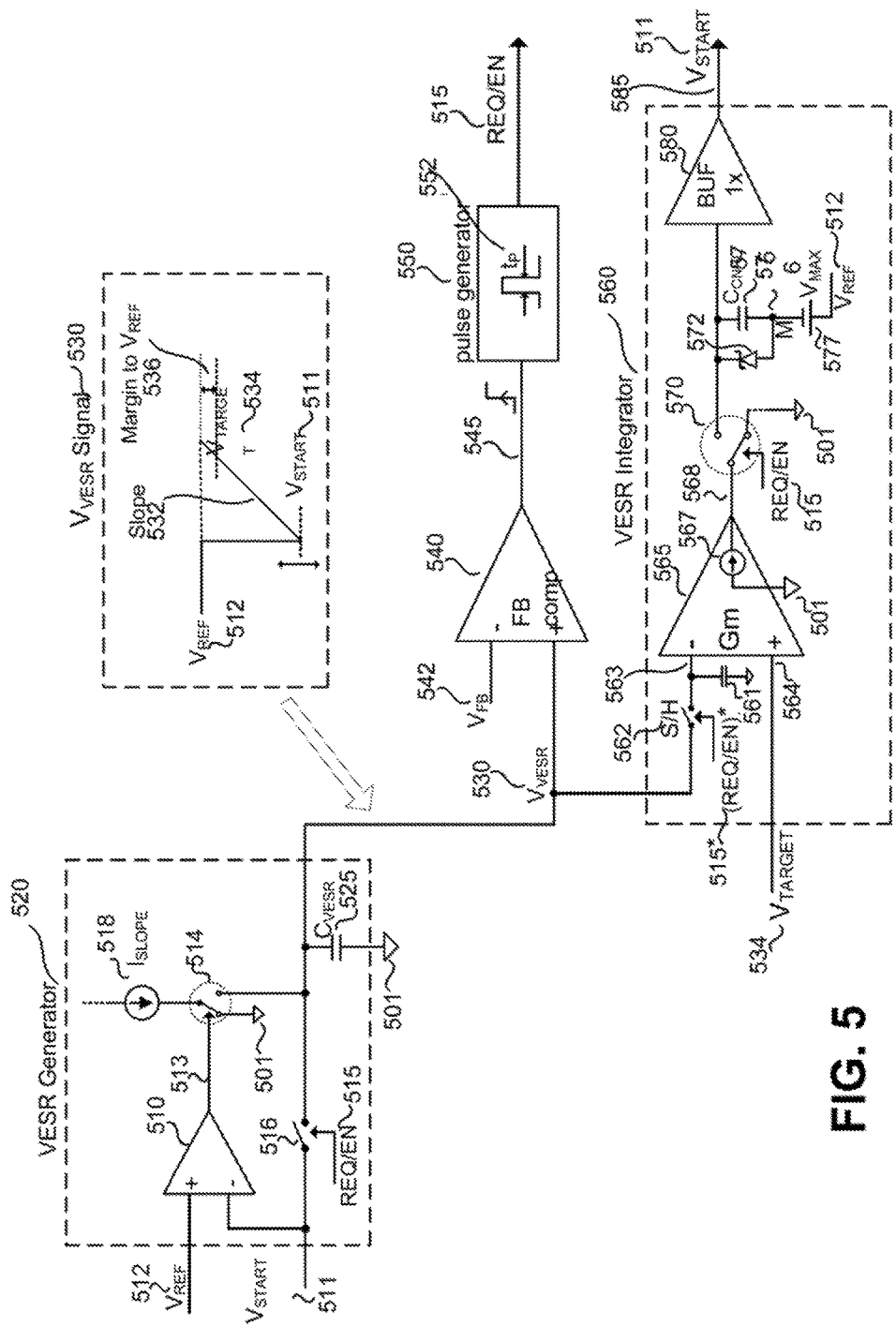
FIG. 5 is another example circuit schematic diagram for implementing adaptive virtual ESR compensation for use in a power converter controller.

FIG. 5 is another example circuit schematic diagram for implementing adaptive virtual ESR compensation for use in a power converter controller with an adaptive (controlled) start point. As shown, circuit block 520 generates the predefined (required) signal waveform for the virtual ESR (equivalent series resistor) of output capacitance that may modulate the FB signal. In operation, VESR generator 520 receives a reference voltage $V_{REF}$ 512 and a start voltage level $V_{START}$ 511 as inputs and generates voltage signal $V_{ESR}$ at output node 530.

In the embodiment shown, VESR generator 520 includes a comparator 510 that compares signal $V_{START}$ 511 at its negative input to signal $V_{REF}$ 512 at its positive input to generate logic signal 513 at the output of comparator 510. Logic signal 513 controls a two-pole switch 514 in the current path of a current source $I_{SLOPE}$ 518. As long as the voltage level of $V_{START}$ 511 has not reached $V_{REF}$ 512 output signal 513 is at a logic high level and switch 514 conducts current $I_{SLOPE}$ 518 to charge capacitor $C_{VESR}$ 525. Charging of capacitor 525 produces voltage signal $V_{ESR}$ 530 with a linear slope, $d(V_{ESR})/dt = I_{SLOPE}/C_{VESR}$, from a start voltage level $V_{START}$ 511, as shown in the $V_{ESR}$ waveform block 530. If $V_{START}$ 511 reaches or exceeds $V_{REF}$ 512, then output signal 513 of the comparator 510 transitions to a logic low level and switch 514 conducts current $I_{SLOPE}$ 518 to ground 501. In every switching cycle when switch 516 is closed through a narrow pulse REQ/EN 515 the initial voltage on capacitor $C_{VESR}$ 525 is defined by the start voltage level $V_{START}$. Signal $V_{START}$ 511 adaptively changes in a closed loop with the load or line variation as depicted in the signal diagrams of FIGS. 6A & 6B (discussed below).

Signal $V_{VESR}$ 530 is shown connected to the positive input of feedback comparator 540, where it is compared to feedback signal $V_{FB}$ 542 applied to the negative input. When signal $V_{FB}$ 542 goes below signal $V_{VESR}$ 530 the output signal 545 of comparator 540 transitions from a logic low to a logic high level, which causes pulse generator 550 to generate a pulse 552 having a narrow width "$t_P$", which is the request/enable signal REQ/EN 515 applied to control the conducting state of switches 516, 562 and 570.

Continuing with the example of FIG. 5, signal $V_{VESR}$ 530 is also shown coupled to VESR integrator circuit block 560. More specifically, $V_{VESR}$ 530 is coupled to the negative input of transconductance amplifier 565 (having a transconductance gain Gm) through a sample and hold switch S/H 562. The positive input of transconductance amplifier 565 is coupled to a target voltage level $V_{TARGET}$ 534. Sample and hold switch 562 is enabled through a complementary value of the request/enable signal ($\overline{REQ/EN}$) 515*. Output switch 570 is enabled through request/enable signal REQ/EN 515. In other words, $V_{VESR}$ 530 may be sampled when signal REQ/EN 515 is at a logic low level. The output signal 568 produced from output current source 567 may be coupled/transferred to the output buffer stage 580 when request/enable signal REQ/EN 515 is logically high.

When applied to the input of buffer 580, output signal 568 charges a control capacitor $C_{CNRL}$ 575 in reference to its lower plate potential of $V_{REF}-V_{MAX}$ at node M 576, wherein $V_{MAX}$ presents the maximum amplitude of signal $V_{VESR}$ 530. A zener diode 572 clamps the voltage applied across control capacitor $C_{CNRL}$ 575. The output signal 585 of buffer 580 closes the adaptive loop for $V_{START}$ signal 511.

Figure 6:
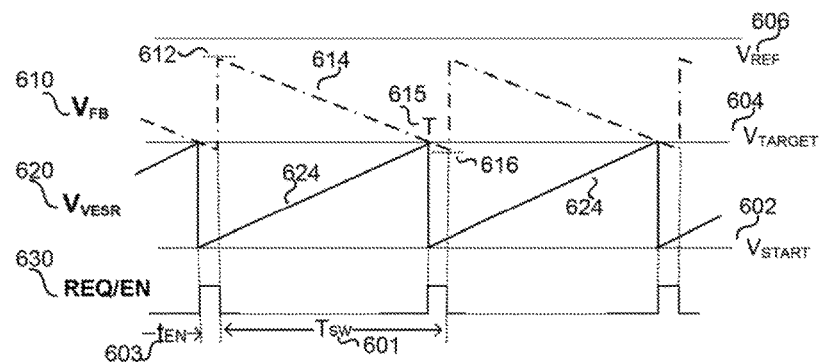
FIGS. 6A & 6B are example waveform timing diagrams of various signals generated during operation of the example circuit shown in FIG. 5.
Figure 6:
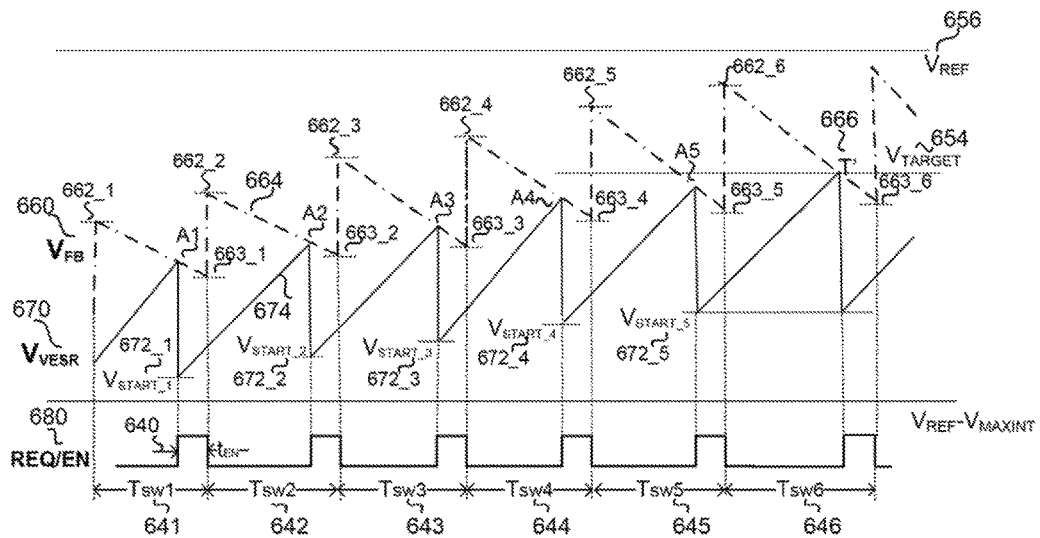

FIGS. 6A & 6B are example waveform timing diagrams of various signals generated during operation of the example circuit shown in FIG. 5. FIG. 6A shows a steady state operation, whereas FIG. 6B shows a response during a transition from a low load to a heavy load. In the example diagram of FIG. 6A, the top signal is the feedback signal $V_{FB}$ 610, shown as $V_{FB}$ 542 in FIG. 5. In each switching cycle $T_{sw}$ 601, VFW signal 610 drops from a maximum level 612 to minimum level 616 with a substantially linear slope 614. Virtual ESR signal $V_{VESR}$ 620 (530 in FIG. 5) is shown increasing linearly with slope 624 from an adaptively adjusted start voltage level $V_{START}$ 602 towards a target voltage level $V_{TARGET}$ 604 that is defined on the feedback voltage $V_{FB}$ 610. When $V_{VESR}$ 620 rises to the point where it exceeds feedback signal $V_{FB}$ 610 at point T 615, request/enable signal REQ/EN 630 transitions from logic low to logic high, thereby generating a narrow pulse having a duration $t_{EN}$ 603 to the end of the cycle.

As discussed in connection with FIG. 5, as long as REQ/EN signal 630 is at a logic low level, the voltage across capacitor 599 applied to the negative input of transconductance amplifier 565 tracks $V_{VESR}$ signal 620. When REQ/EN signal 630 goes to a logic high level, output current 568 charges control capacitor 575 responsive to the difference between $V_{VESR}$ signal 620 and $V_{TARGET}$ 604 (534 in FIG. 5). Capacitor 575 is charged in reference to $V_{REF}-V_{MAX}$. Reference voltage level $V_{REF}$ 606 is selected at a higher level compared to a maximum level 612 of the $V_{FB}$ signal 610.

FIG. 6B shows an example transient timing diagram of signals in transition from a low load to a heavy load. Feedback signal $V_{FB}$ 660, in the upper part of the diagram, is shown moving progressively to a higher level in each subsequent switching cycle. By way of example, in each of switching cycles $T_{sw1}$ 641, $T_{sw2}$ 642, $T_{sw3}$ 643, $T_{sw4}$ 644, $T_{sw5}$ 645 and $T_{sw6}$ 646, the maximum value of $V_{FB}$ 660 rises from 662_1 up to 662_6, respectively. At the same time, the minimum value of $V_{FB}$ 660 respectively increases from 663_1 up to 663_6. Similarly, adaptive $V_{VESR}$ signal 670 is shown linearly increasing in each subsequent switching cycle (in one embodiment with a fixed slope) from a start voltage level $V_{START\_1}$ 672_1 up to $V_{START\_5}$ 672_5. In each switching cycle $V_{VESR}$ signal 670 reaches/exceeds $V_{FB}$ 660 at points A1, A2, A3, A4, and A5, all of which are at a lower level as compared to target voltage level $V_{TARGET}$ 654. The adaptive $V_{START}$ voltage in each subsequent switching cycle is increased in a closed loop manner, as discussed in connection with FIG. 5 (signal $V_{START}$ 511) to a value that results in $V_{VESR}$ reaching/exceeding $V_{TARGET}$ 654. At that point, if no further transients occur, the control loop may continue thereafter in a steady state condition.

Note that the enabling/request pulse signals REQ/EN 680 shown at the bottom of FIG. 6B rise from logic low to logic high at the point that $V_{VESR}$ reaches the level of feedback signal $V_{FB}$ (e.g., at A1, A2, . . . A5), generating narrow pulses 640) to the end of each switching cycle.

It is appreciated that even though the present disclosure provides examples of the adaptive compensation of start voltage level and the slope for the virtual ESR signal ($V_{VESR}$) individually, in other embodiments both the start voltage level and the slope of the virtual ESR signal ($V_{VESR}$) may be changed simultaneously and adaptively (controlled) based on load and line variation to achieve improved stability in a control loop.

The above description of examples of the present disclosure is not intended to be exhaustive or limited to the embodiments disclosed. While specific embodiments of, and examples for, the invention are described herein for illustrative purposes, various equivalent modifications are possible without departing from the broader spirit and scope of the present invention. Indeed, it is appreciated that the specific example circuit diagrams, methods of operation, etc., are provided for explanation purposes and that other circuits and devices may be employed in other embodiments and examples in accordance with the teachings of the present disclosure. These modifications can be made to the examples provided in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. A switched mode power converter comprising:
   an energy transfer element that receives an unregulated input signal coupled to a primary side of the energy transfer element, the energy transfer element having a secondary side that delivers an output signal to a load;
   a power switching device coupled to the primary side of the energy transfer element for regulating a transfer of energy to the load;
   a feedback circuit that generates a feedback signal by sensing he output signal;
   a controller that includes a primary controller and a secondary controller, the secondary controller being coupled to receive the feedback signal and output a pulsed signal in response thereto, the primary controller being coupled to receive the pulsed signal and output a drive signal in response thereto, the drive signal being coupled to control switching of the power switching device,
   the secondary controller includes a compensation circuit that generates an adaptively compensated signal synchronous with the pulsed signal, the adaptively compensated signal having a ramp waveform that ramps upward with a slope that is adaptively adjusted in response to a comparison of the feedback signal with a threshold reference signal, wherein the slope converges towards a final value that produces a desired level of the output signal, thereby regulating transfer of energy from the primary side to the secondary side, the compensation circuit being configured to generate the adaptively compensated signal at an output node wherein the slope of the ramp waveform increases during intervals when a ramp current is below a pre-threshold current that is a fraction of a threshold current, the slope of the ramp waveform decreasing during intervals when the ramp current is above the pre-threshold current, the adaptively compensated signal being clamped when the ramp current is above the threshold current.

2. The switched mode power converter of claim 1 wherein the primary controller is disposed on a first integrated circuit die and the secondary controller is disposed on a second integrated circuit die galvanically isolated from the first integrated circuit die.

3. The switched mode power converter of claim 1 wherein the energy transfer element includes a primary winding coupled to receive the unregulated input signal, and a secondary winding, the switched mode power converter further comprising an output capacitor coupled across the second winding, the output capacitor having an associated equivalent series resistance (ESR).

4. The switched mode power converter of claim 1 wherein the compensation circuit is configured to synchronize the adaptively compensated signal with the pulsed signal.

5. The switched mode power converter of claim 1 wherein the ramp waveform rises with the slope until it crosses a level of the feedback signal.

6. The switched mode power converter of claim 1 wherein the compensation circuit comprises a summation block that adds the adaptively compensated signal to the feedback signal.

7. The switched mode power converter of claim 6 wherein the compensation circuit further comprises a comparator having -a first input coupled to the summation block to receive a sum of the adaptively compensated signal and feedback signal, and a second input coupled to receive the threshold reference signal, the output of the comparator generating the pulsed signal.

8. The switched mode power converter of claim 1 wherein the compensation circuit comprises a subtraction block that subtracts the adaptively compensated signal from the threshold reference signal.

9. The switched mode power converter of claim 8 wherein the compensation circuit further comprises a comparator having a first input coupled to receive the feedback signal, and a second input coupled to the subtraction block to receive a difference of the adaptively compensated signal and the threshold reference signal, the output of the comparator generating the pulsed signal.

10. A controller for a switched mode power converter, the switched mode power converter having an energy transfer element that receives an unregulated input voltage coupled to a primary side of the energy transfer element, the energy transfer element having an secondary side that delivers an output signal to a load, a power switching device being coupled to the primary side of the energy transfer element for regulating a transfer of energy to the output signal delivered to the load, an output capacitor having an associated equivalent series resistance (ESR), the output capacitor being coupled across the secondary side of the energy transfer element, the switched mode power converter also including a feedback circuit that senses the output signal and generates a feedback signal therefrom, the controller comprising:
   a primary controller and a secondary controller, the secondary controller being coupled to receive the feedback signal and output a pulsed signal in response thereto, the primary controller being coupled to receive the pulsed signal and output a drive signal in response thereto, the drive signal being coupled to control switching of the power switching device, the secondary controller includes a compensation circuit, which comprises:
      a first capacitor coupled between a supply bus and a first node;
      a first current source coupled between the first node and ground;
      a reset device coupled across the first capacitor, when activated, the reset device discharging the first capacitor, the first capacitor charging when the reset device is not activated;
      a voltage follower circuit coupled to the first node and to a first switching device, the voltage follower circuit being configured such that when the reset device is activated, no current flows through the first switching device, and when the reset device is not activated, a ramp current flows through the first switching device;

a current mirror that includes a first leg having a second switching device, and a second leg having a third switching device, the first leg being configured such that the second switching device conducts as long as the ramp current flowing through the first switching device is below a threshold current, the second leg being configured such that the third switching device conducts as long as the ramp current flowing through the first switching device is below a pre-threshold current that is a fraction of the threshold current; a second node in the second leg being a logic high value when the ramp current is below the pre-threshold current, the second node being a logic low value when the ramp current is greater than the pre-threshold current;

a voltage-controlled current source having an input coupled to the second node through a low pass filter and a fourth switching device that is enabled by the pulsed signal, an output of the voltage-controlled current source being coupled to the first capacitor such that a charging current of the first capacitor is increased during intervals when the fourth switching device conducts and the ramp current is below the pre-threshold current, and decreased during intervals when the fourth switching device conducts and the ramp current is above the pre-threshold current;

the current mirror including a third leg having a fifth switching device, the third leg being configured such that when the ramp current is below the threshold current, the fifth switching device conducts the ramp current and when the ramp current is above the threshold current, the fifth switching device is clamped and conducts the threshold current, thereby generating an adaptively compensated signal synchronous with the pulsed signal, the adaptively compensated signal having a ramp waveform with a ramp slope that adaptively changes in response to a comparison of the feedback signal with a threshold reference signal, wherein the ramp slope converges towards a final slope that produces a desired potential level of the output signal, thereby regulating transfer of energy from the primary side to the secondary side.

11. The controller of claim 10 wherein the first switching device is a diode-connected transistor.

12. The controller of claim 10 wherein the low pass filter comprises a resistor connected with a capacitor, the capacitor being coupled between an input of the voltage-controlled current source and ground.

13. The controller of claim 10 wherein the low pass filter integrates a change in voltage at the second node over successive switching cycles of the pulsed signal.

14. The controller of claim 10 wherein the reset device comprises a MOSFET.

15. A controller for a switched mode power converter, comprising:

means for generating a linear ramp waveform for a virtual equivalent series resistor that in each switching cycle starts from a start voltage signal, the linear ramp waveform ramping up to a final voltage at the end of each switching cycle, the means for generating the linear ramp waveform including a first comparator that at one input receives the start voltage signal and compares it to a reference voltage to generate a first logic signal at an output of the first comparator, an adaptively compensated signal being generated across a capacitor coupled to the start voltage signal through a first switch controlled by a pulsed signal at a beginning of each switching cycle, the capacitor also being coupled to the output of the first comparator through a second switch in a current path of a current source, the second switch being controlled by the first logic signal to charge the capacitor towards the target voltage, the capacitor being charged at a beginning of each switching cycle in response to the pulsed signal; and means for minimizing the difference between a target voltage and, an intercept voltage of a feedback voltage waveform and the linear ramp waveform by adaptively adjusting the start voltage signal synchronous with each switching cycle in a closed loop control process, wherein the target voltage is defined with a margin from the reference voltage, the means for minimizing including an integrator circuit which includes a transconductance amplifier having a first input coupled to receive the adaptively compensated signal, and a second input coupled to receive the target voltage, an output signal of the transconductance amplifier being coupled to circuitry that generates the start voltage signal coupled to the first comparator; and wherein during a transition from a low load to a high load on the switched mode power converter the start voltage signal is adaptively increased, and during a transition from a high load to a low load on the switched mode power converter the start voltage signal is adaptively reduced.

\* \* \* \* \*